US008081466B2

(12) United States Patent
Kaufman et al.

(10) Patent No.: US 8,081,466 B2
(45) Date of Patent: Dec. 20, 2011

(54) OVERMOLDED ELECTRONICS ENCLOSURE

(75) Inventors: Andrew P. Kaufman, Milwaukee, WI (US); Douglas R. Bodmann, Shaker Heights, OH (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 155 days.

(21) Appl. No.: 12/497,917

(22) Filed: Jul. 6, 2009

(65) Prior Publication Data
US 2011/0002100 A1 Jan. 6, 2011

(51) Int. Cl.
H05K 7/20 (2006.01)
(52) U.S. Cl. ........ 361/708; 361/688; 361/690; 361/816; 361/818
(58) Field of Classification Search .................. None
See application file for complete search history.

(56) References Cited

U.S. PATENT DOCUMENTS

| | | | |
|---|---|---|---|
| 4,768,286 A * | 9/1988 | Ketcham | 29/841 |
| 5,015,192 A | 5/1991 | Welsh et al. | |
| 5,387,119 A | 2/1995 | Wood | |
| 5,614,143 A | 3/1997 | Hager | |
| 5,675,473 A * | 10/1997 | McDunn et al. | 361/699 |
| 5,682,289 A * | 10/1997 | Schwegler et al. | 361/679.33 |
| 5,733,145 A | 3/1998 | Wood | |
| 6,151,219 A | 11/2000 | Dye | |
| 6,180,045 B1 * | 1/2001 | Brandenburg et al. | 264/263 |
| 6,307,749 B1 * | 10/2001 | Daanen et al. | 361/704 |
| 6,404,596 B1 | 6/2002 | McReynolds et al. | |
| 6,779,260 B1 * | 8/2004 | Brandenburg et al. | 29/841 |
| 6,807,731 B2 * | 10/2004 | Brandenburg et al. | 29/841 |
| 6,862,181 B1 * | 3/2005 | Smith et al. | 361/690 |
| 6,966,800 B2 | 11/2005 | Mott | |
| 7,078,802 B2 | 7/2006 | Gaynes et al. | |
| 7,132,746 B2 | 11/2006 | Brandenburg et al. | |
| 7,140,969 B2 | 11/2006 | Prucher | |
| 7,144,259 B2 | 12/2006 | Ice et al. | |
| 7,151,427 B2 | 12/2006 | Muller et al. | |
| 7,198,987 B1 | 4/2007 | Warren et al. | |
| 7,230,829 B2 | 6/2007 | Mandel et al. | |
| 7,249,971 B2 | 7/2007 | Burke et al. | |
| 7,271,513 B2 | 9/2007 | Xu et al. | |
| 7,319,571 B2 | 1/2008 | Xu et al. | |
| 7,359,144 B2 | 4/2008 | Xu et al. | |
| 7,372,133 B2 | 5/2008 | Shojaie et al. | |
| 7,372,151 B1 | 5/2008 | Fan et al. | |
| 7,514,480 B2 * | 4/2009 | Mekhilef et al. | 522/156 |
| 7,616,448 B2 * | 11/2009 | Degenkolb et al. | 361/752 |
| 2006/0012969 A1 * | 1/2006 | Bachman | 361/816 |

* cited by examiner

Primary Examiner — Gregory Thompson
(74) Attorney, Agent, or Firm — Fay Sharpe LLP; R. Scott Speroff; John M. Miller

(57) ABSTRACT

An enclosure for electronics includes a body with a metal component and a polymeric component overmolded onto the metal component so as to be connected to the metal component without fasteners. The body defines a recess. A heat sink is defined in the metal component. A printed circuit board is located in the recess and includes a plurality of electronic components mounted thereon. The polymeric component includes at least one attachment feature that captures the printed circuit board at a select location in the recess such that: (i) at least a first one of the electronic components is electrically connected to a contact region of the metal component that is exposed through a portion of said polymeric component; (ii) at least a second one of the electronic components is electrically isolated from the metal component by an electrical isolation zone of the polymeric component; and (iii) at least a third one of the electronic components is located adjacent a thermal transfer region of the metal component that underlies the heat sink. The thermal transfer region is uncovered by the polymeric component so as to be exposed in the recess.

12 Claims, 5 Drawing Sheets

OVERMOLDED ELECTRONICS ENCLOSURE

BACKGROUND

It is known to manufacture enclosures for circuit boards and other electronic components from a metal or a polymeric material, each of which has advantages in terms of ease of manufacturability, cost, toughness, thermal properties, electrical properties, weight, etc. It is also know to manufacture an electronic enclosure using a combination of metal and polymeric materials, where the metal and polymeric portions of the enclosure are manufactured separately and then assembled together using fasteners and like means to define the enclosure. All of these prior enclosure structures exhibit some deficiencies in terms of physical properties, cost, manufacturability, complexity, and the like. Accordingly, according to the present development, it has been deemed desirable to provide a new enclosure for electronics that is partially defined from metal and partially defined from a polymeric material, but that does not require separate manufacture and assembly of the metal and polymer components to define the enclosure and that exhibits other benefits and advantages over known enclosures such as those described above.

SUMMARY

In accordance with one aspect of the present development, an enclosure for electronics includes a body defining a recess adapted to receive at least one associated electronic component. The body includes a metal component and at least one polymeric component overmolded thereon so that the at least one polymeric component is bonded to and mechanically interconnected with the metal component. The polymeric component includes at least one electrical isolation zone that electrically insulates the metal component from the electronic component located in the recess. The polymeric component also includes at least one attachment feature for capturing the associated electronic component in the recess.

In accordance with another aspect of the present development, a method of manufacturing an electronics enclosure includes providing a metal component that defines a first part of an enclosure body. The metal component defines a heat sink. The method further includes placing the metal component in a mold and overmolding a polymeric component onto part of the metal component by an injection molding process such that the polymeric component defines a second part of the enclosure body that is mechanically interlocked with the metal component. A complete enclosure body is defined by the first and second parts of the enclosure body and includes a recess adapted to receive and retain an associated electronic component. The polymeric component defines at least one electrical isolation zone that covers and electrically insulates a first portion of the metal component from the associated electronic component. The electrical isolation zone including at least one opening that exposes a second portion of the metal component such that the exposed second portion of the metal component defines an electrical contact adapted to be connected to an electrical ground connection of the associated electronic component.

In accordance with another aspect of the present development, an enclosure for electronics includes a body comprising a metal component and a polymeric component overmolded onto the metal component so as to be connected to the metal component without fasteners. The body defines a recess. A heat sink is defined in the metal component. A printed circuit board is located in the recess and includes a plurality of electronic components mounted thereon. The polymeric component includes at least one attachment feature that captures the printed circuit board at a select location in the recess such that: (i) at least a first one of the electronic components is electrically connected to a contact region of the metal component that is exposed through a portion of said polymeric component; (ii) at least a second one of the electronic components is electrically isolated from the metal component by an electrical isolation zone of the polymeric component; and (ii) at least a third one of the electronic components is located adjacent a thermal transfer region of the metal component that underlies the heat sink. The thermal transfer region is uncovered by the polymeric component so as to be exposed in the recess.

DETAILED DESCRIPTION

Figure 3:
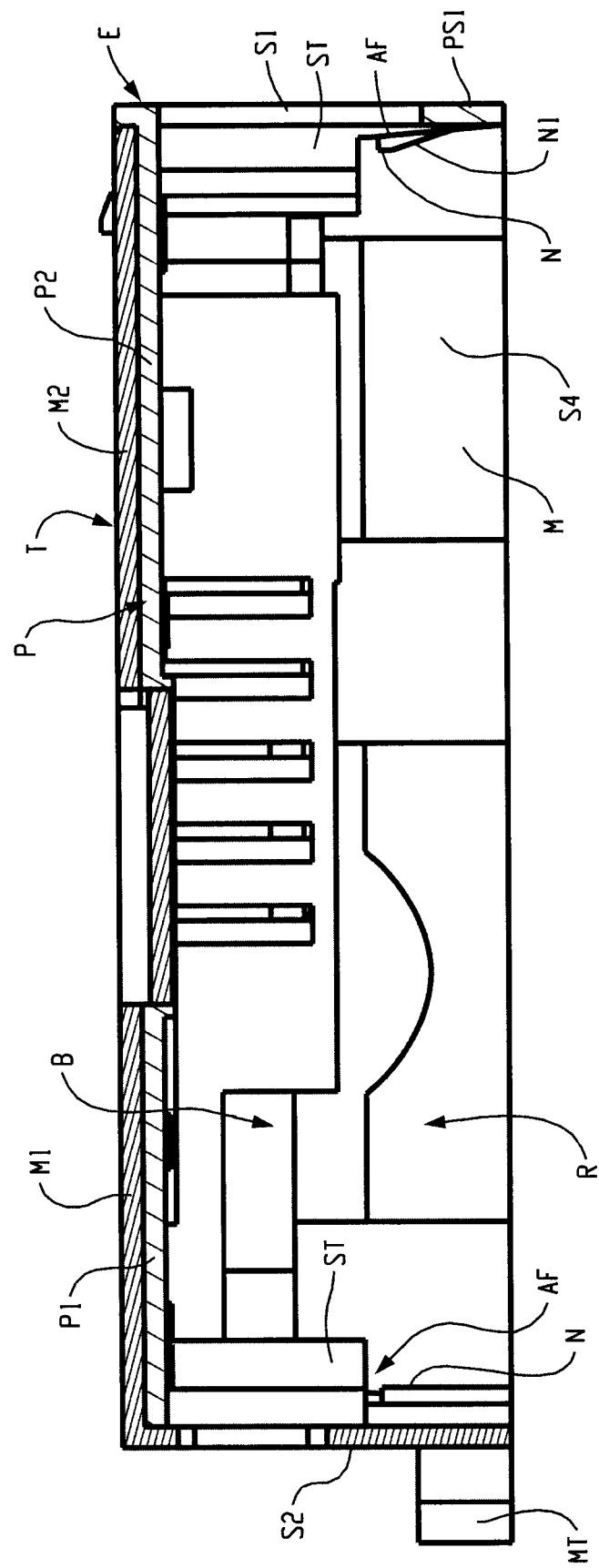
FIG. 3 is a section view as taken at line 3-3 of FIG. 1.
Figure 4:
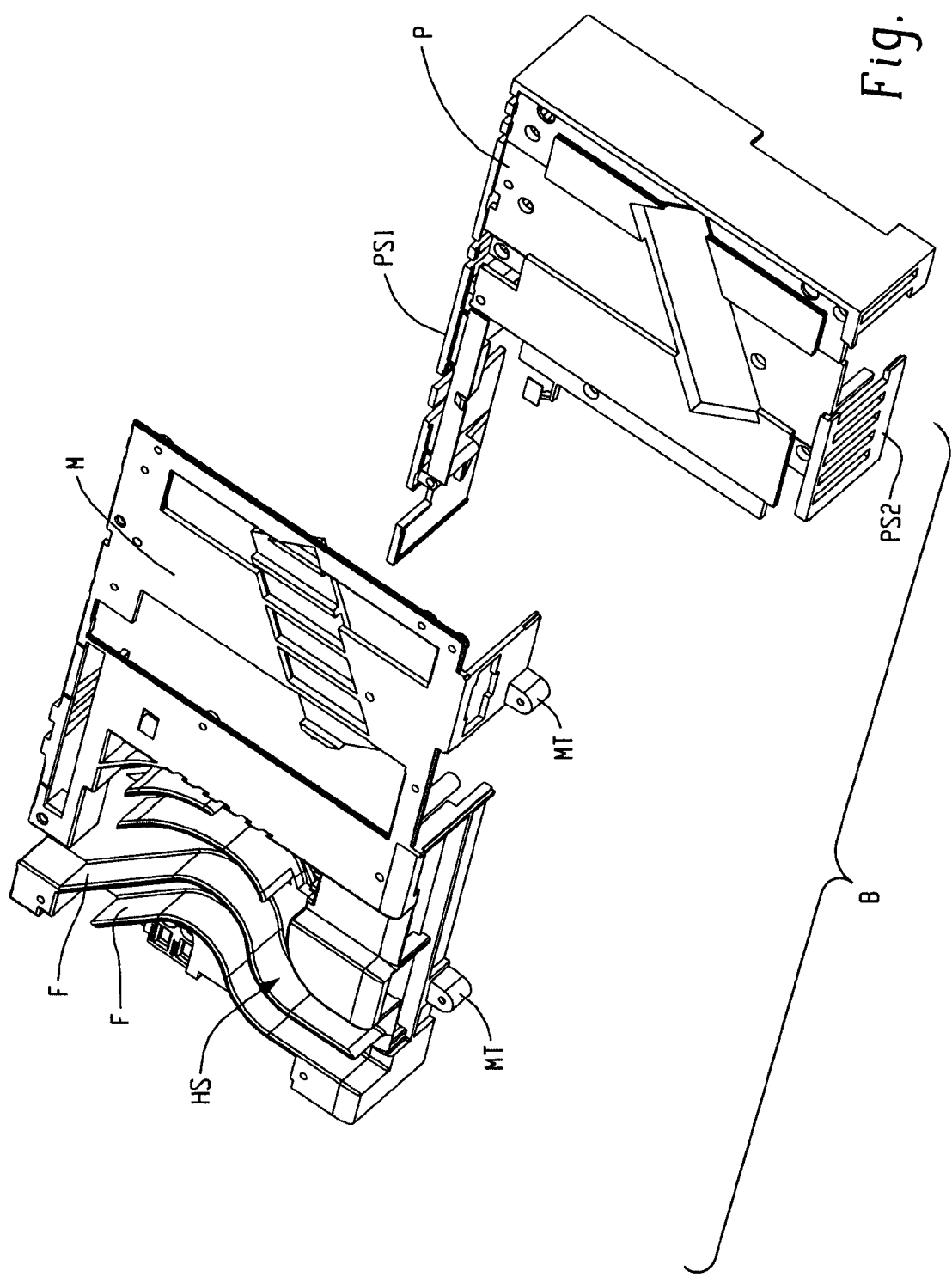
FIG. 4 is an exploded isometric view of the electronics enclosure of FIG. 1.
Figure 5:
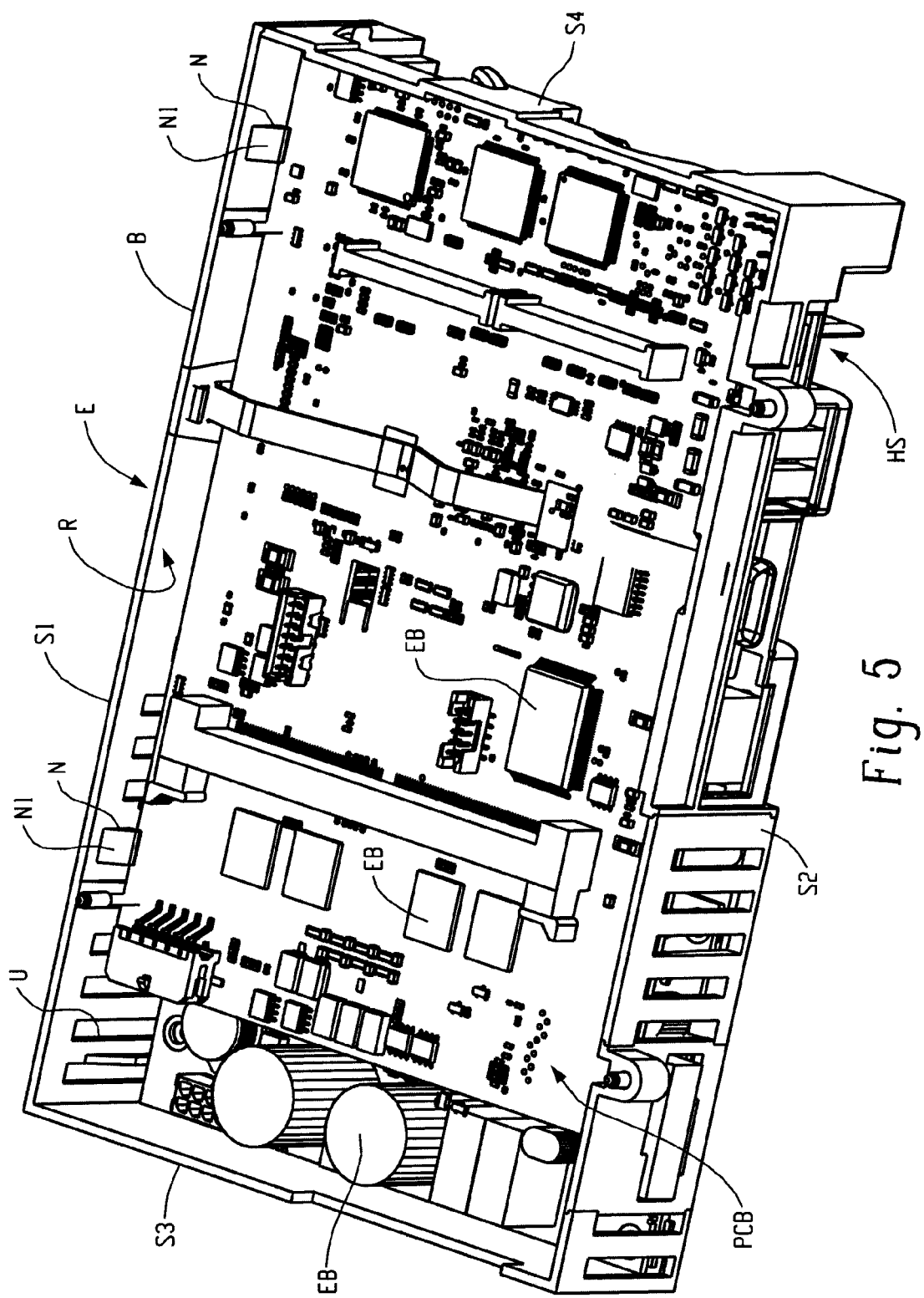
FIG. 5 is similar to FIG. 2 but also shows a printed circuit board including electronic components mounted within the enclosure.

FIGS. 1-5 illustrate an electronics enclosure E formed in accordance with the present development. The term "electronics enclosure" is intended to encompass a structure defining a space or recess adapted to receive and retain electronic components such as one or more printed circuit boards including electronic components mounted thereon. In this regard, the enclosure E includes a body B comprising a plurality of side walls S1,S2,S3,S4 that define a periphery and also includes a top wall T that extends between and interconnects one end of the side walls S1-S4. The side walls S1-S4 and top wall T define a space or recess R adapted to receive and retain electronic components such as at least one printed circuit board PCB including electronic components mounted thereon as shown in FIG. 5.

The body B comprises a single mechanical package or component that is defined by a single metal body component M (FIG. 4) and one or more polymeric body components P (FIG. 4) that are overmolded onto the metal component M so as to be bonded or adhered to and mechanically interlocked with the metal body component M and, thus, inseparable from the metal body component M without physically damaging the metal and/or polymeric body components M, P. No fasteners, such as screws, rivets or clips, are used to interconnect the polymeric component P to the metal component M. In the illustrated example, the body B includes only a single, one-piece polymeric body component P.

FIG. 4 is an exploded isometric view that reveals the single metal body component M and the single polymeric body component P that is overmolded onto the metal body component M so as to define the single-component body B. The metal component M is defined from an electrically and thermally conductive metal such as aluminum, steel alloy or the like and is cast and/or otherwise defined as a one-piece construction. The polymeric component P is defined from an injection molded polymer ("plastic") that is overmolded to the metal component M after the metal component is placed in a mold. Accordingly, the polymeric material flows into voids defined in the metal component M and into voids defined between the metal component M and the associated mold component(s) in which the metal component M is positioned during the overmolding process. Thus, the polymeric component P includes various portions that are mechanically interlocked with the metal component M after the polymer used to mold the polymeric component P cools and hardens or cures, so that the metal component M and polymeric component P are not only adhered together but are also permanently mechanically interconnected through the overmolding process in which the molten polymeric material flows into voids of the metal component M such that the polymeric component P cannot be separated from the metal component M without destruction of the metal and/or polymeric component once the molding process is completed and the polymer cools and hardens or cures. In the illustrated embodiment, the top wall T and at least one of the side walls S1-S4 are defined by a combination of portions of the metal component M and one or more portions of the polymeric component P.

As compared to the polymeric component P (or as compared to an all polymeric enclosure body), the metal component M of the enclosure body B is superior for providing a first set of features and characteristics to the enclosure E. For example, the strength of the metal component M makes it an ideal location for multiple mounting tabs MT including respective apertures that are adapted to be engaged by associated fasteners for securing the enclosure E to a desired mounting location or mating enclosure E. The mounting tabs MT are external to the recess R.

The metal component M also provides a means for functional electrical/logic grounding. In the illustrated embodiment, the metal component M includes one or more electrical contact regions EC that are located within the recess R and that are adapted to be electrically connected to one or more electronic components located in the recess R, such as the ground circuit of the printed circuit board PCB or an electrical component EB mounted thereon. As shown, the electrical contact regions EC are electrically connected to the printed circuit board PCB to provide electrical grounding for the electrical components mounted on the printed circuit board PCB. As is generally known in the art, the metal component M can, itself, be connected to another electrical ground location such as a mounting rail, chassis or the like such that the metal component M provides an electrical grounding pathway between the electronic components PCB contained in the recess R and the associated electrical ground location to which the metal component M is electrically connected. It should be noted that the metal component M also shields the electronic contents of the recess R from electromagnetic interference (EMI).

The metal component M also provides a thermal pathway to conduct heat out of the enclosure recess R. In particular, the metal component includes or defines at least one heat sink HS. As shown, the heat sink HS is defined by a plurality of fins F separated from each other by airflow passages AP. The fins F follow a curved path to maximize the surface area in contact with the ambient air flowing through the passages AP.

In contrast to the metal component M (or as compared to an all metal enclosure body), the polymeric component P of the enclosure body B is superior for providing a second set of features and characteristics to the enclosure E. For example, the polymeric component P provides superior structural compliance and electrical insulation capabilities.

Figure 1:
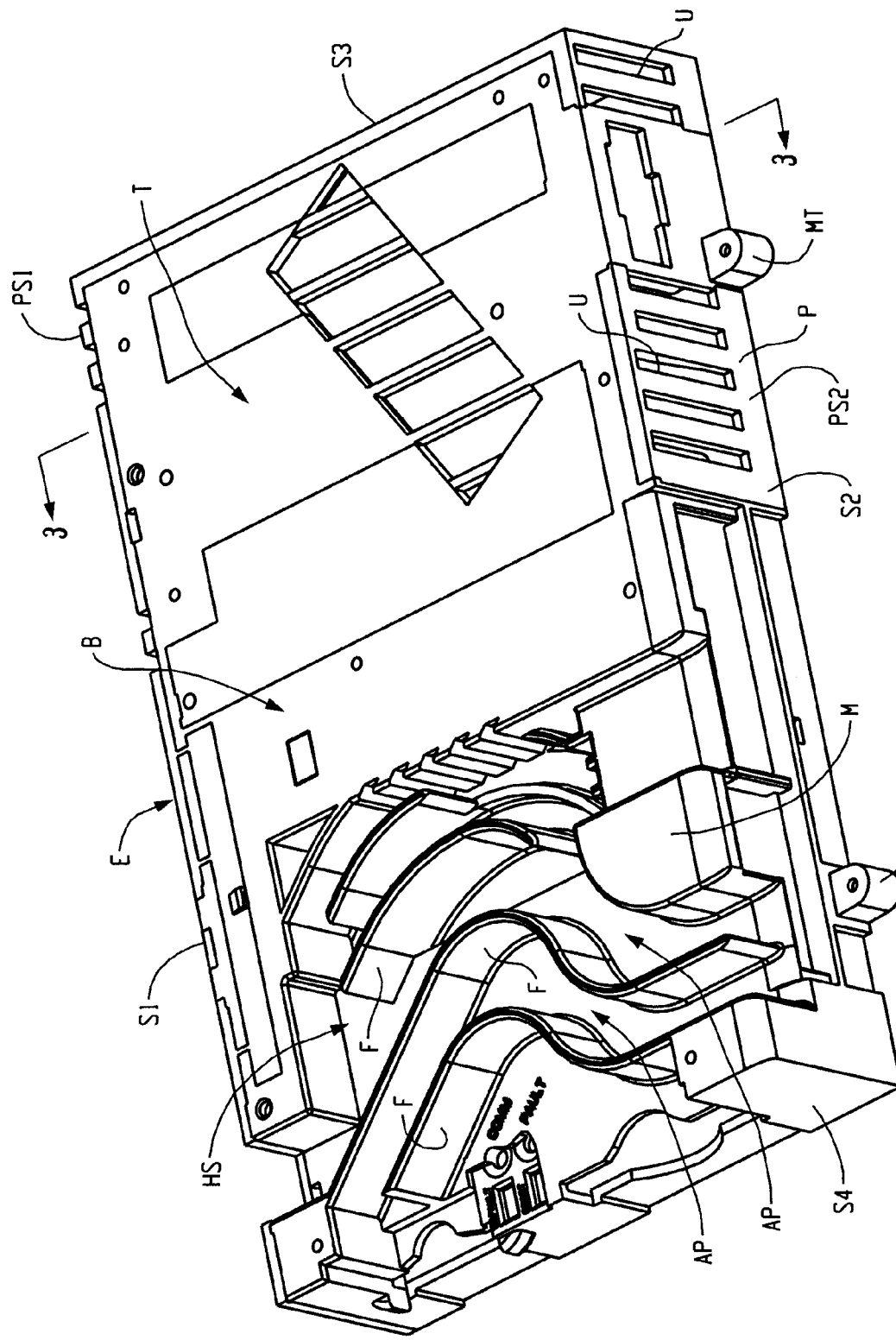
FIG. 1 is an isometric view from above of an electronics enclosure formed in accordance with the present development.
Figure 2:
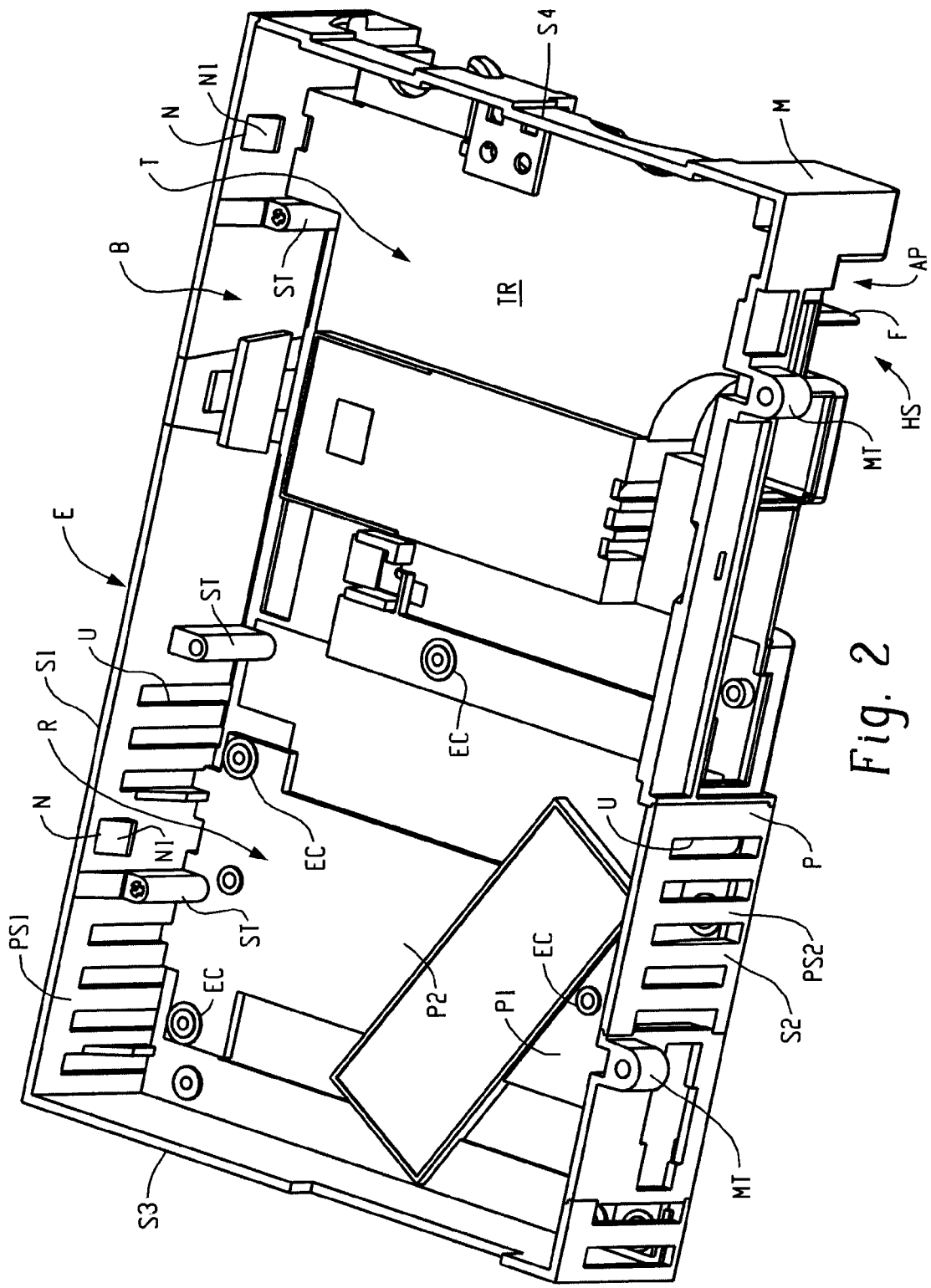
FIG. 2 is an isometric view from below of the electronics enclosure of FIG. 1.

With reference to FIGS. 2 and 3, it can be seen that portions P1 and P2 of the polymeric component P respectively cover internal surfaces of portions M1,M2 of the metal component M in the top wall T of the enclosure to electrically insulate the portions M1,M2 from electronic components contained in the enclosure recess R. Thus, the portions P1,P2 of the polymeric component P define electrical isolation zones that help to protect a user or other person from high-voltage or electrical charges that might otherwise be conducted through the metal component M. As shown herein, some or all of the electrical contact regions EC are defined by specially located openings or voids in the electrical isolation zone(s) P1,P2 that expose the underlying metal component M for desired electrical ground connections with the electronic components PCB. It is preferred that a thermal transfer region TR (FIG. 2) of the metal component M underlying each/the heat sink HS be exposed and not covered by isolation zones of the polymeric component P in order to maximize heat transfer from electronic components located in the recess R to the heat sink HS.

With respect to structural compliance, the polymeric component P, as overmolded to the metal component M, include a plurality of attachment features AF for securing one or more electronic components, such as a printed circuit board PCB, within the recess R. In one example, as shown herein, a first side wall portion PS1 of the polymeric component P defines part of the enclosure body side wall S1 and a second side wall portion PS2 of the polymeric component P defines part of the enclosure body side wall S2, and the attachment features AF are defined as part of the first and second side wall portions PS1,PS2. As shown herein, the attachment features AF of the in the illustrated embodiment are provided one or more printed circuit board retention nibs N defined by the first side wall portion PS1 and/or the second side wall portion PS2 of the polymeric component P. In particular, each nib N is dimensioned and conformed to capture the printed circuit board PCB in the recess R. Specifically, a printed circuit board PCB is captured between each nib N of the polymeric portion P and another portion of the body defined by either the metal or polymeric component M,P. As shown, the nibs N capture the circuit board PCB against supports ST defined by either the metal component M or polymeric component P. It is preferred, as shown herein, that each nib N located on at least one of the side wall portions PS1,PS2 be defined with a ramped surface N1 that diverges away from the side wall portion PS1,PS2 from which it projects as it extends deeper into the recess R toward the top wall IT. The ramped surface N1 and the natural resiliency of the side wall portions PS1, PS2 of the polymeric portion P facilitates a sliding snap-fit engagement of a printed circuit board PCB into the recess R to a position where it is captured in the recess R by the nibs N as shown in FIG. 5, without requiring use of additional fasteners. Also, the printed circuit board PCB can be removed from the recess R by resilient deflection of the polymeric side wall portions PS1,PS2 to disengage the printed circuit board PCB from each nib N. The attachment features AF can alternatively include or be defined by other structures of the polymeric component P that provide for a snap-fit engagement of a printed circuit board PCB or other electronic component with the body B to retain the printed circuit board PCB or other electronic component at a select desired location in the recess R, where at least one electronic component EB thereof is electrically connected to the metal component M through a contact region EC, at least one electronic component EB thereof is electrically isolated from the metal component M by an electrical isolation zone P1,P2 of the polymeric component P, and wherein at least another electronic component EB is located adjacent an uncovered thermal transfer region TR of the metal component M so as to be located to transfer heat into the thermal transfer region TR and to the associated heat sink HS adjacent/under which the thermal transfer region TR is located.

The polymeric component P is also preferred relative to the metal component M for defining air flow slots U and other openings in the enclosure body B. The polymeric component P is injection molded to include such slots U and other openings for connectors and the like so that no milling of the metal component M or other post-processing of either the metal or polymeric component M,P is required once the polymeric component P is overmolded onto the metal component M.

The development has been described with reference to preferred embodiments. Those of ordinary skill in the art will recognize that modifications and alterations to the preferred embodiments are possible. The disclosed preferred embodiments are not intended to limit the scope of the following claims, which are to be construed as broadly as possible, whether literally or according to the doctrine of equivalents.

The invention claimed is:

1. An enclosure for electronics, said enclosure comprising:
   a body comprising a plurality of side walls and a top wall that extends between and interconnects the plurality of side walls;
   said body defining a recess between said plurality of side walls and said top wall, said recess adapted to receive at least one associated electronic component;
   said body comprising a metal component and at least one polymeric component overmolded thereon so that the at least one polymeric component is bonded to and mechanically interconnected with the metal component,
   said at least one polymeric component of said body comprising:
   at least one electrical isolation zone that electrically insulates said metal component from the at least one associated electronic component located in said recess;
   at least one attachment feature for capturing the at least one associated electronic component in the recess, wherein said at least one attachment feature comprises at least one nib that projects outwardly into the recess from one of the sidewalls, wherein said at least one nib is dimensioned and conformed to capture the at least one associated electronic component in the recess.

2. The electronics enclosure as set forth in claim 1, wherein said at least one polymeric component comprises a single, one-piece polymeric component.

3. The electronics enclosure as set forth in claim 1, further comprising a plurality of mounting tabs defined as part of the metal component and located outside said recess, each of said mounting tabs defining an aperture adapted to receive an associated fastener.

4. The electronics enclosure as set forth in claim 1, wherein said at least one nib comprises a ramped surface that diverges away from the side wall to which the nib is connected as the ramped surface extends toward the top wall.

5. An enclosure for electronics, said enclosure comprising:
   a body defining a recess adapted to receive at least one associated electronic component, said body comprising a metal component and at least one polymeric component overmolded thereon so that the at least one polymeric component is bonded to and mechanically interconnected with the metal component;
   said at least one polymeric component comprising:
   at least one electrical isolation zone that electrically insulates said metal component from the at least one associated electronic component located in said recess;
   at least one attachment feature for capturing the at least one associated electronic component in the recess;
   said metal component comprising a heat sink, wherein said heat sink comprises a plurality of fins separated from each other by air flow passages.

6. The electronics enclosure as set forth in claim 5, wherein a portion of said metal component underlying said heat sink and located in said recess is uncovered by said at least one polymeric component so as to increase heat transfer from said recess to said heat sink.

7. An enclosure for electronics, said enclosure comprising:
   a body defining a recess adapted to receive at least one associated electronic component, said body comprising a metal component and at least one polymeric component overmolded thereon so that the at least one polymeric component is bonded to and mechanically interconnected with the metal component, said at least one polymeric component comprising:
   at least one electrical isolation zone that electrically insulates said metal component from the at least one associated electronic component located in said recess, wherein said at least one electrical isolation zone includes an opening therein that exposes an underlying portion of the metal component that defines an electrical contact adapted for mating with an electrical ground connection of the at least one associated electronic component; and,
   at least one attachment feature for capturing the at least one associated electronic component in the recess.

8. The electronics enclosure as set forth in claim 7, wherein the metal component is a one-piece construction.

9. A method of manufacturing an electronics enclosure, said method comprising:
   providing a metal component that defines a first part of an enclosure body, said metal component defining a heat sink;
   placing the metal component in a mold and overmolding a polymeric component onto part of the metal component by an injection molding process such that said polymeric component defines a second part of the enclosure body that is mechanically interlocked with said metal component, wherein a combined enclosure body is defined by said first and second parts of said enclosure body, said combined enclosure body comprising a recess adapted to receive and retain an associated electronic component;
   said polymeric component defining at least one electrical isolation zone that covers and electrically insulates a first portion of the metal component from the associated electronic component, said at least one electrical isolation zone including at least one opening that exposes a second portion of the metal component such that the exposed second portion of the metal component defines an electrical contact adapted to be connected to an electrical ground connection of the associated electronic component.

10. The method as set forth in claim 9, wherein said overmolding step comprises defining at least one attachment feature in said polymeric component, said at least one attachment feature adapted to engage and retain the associated electronic component in the recess.

11. The method as set forth in claim 10, wherein said at least one attachment feature comprises a nib with a ramped surface.

12. An enclosure for electronics, said enclosure comprising:
   a body comprising a metal component and a polymeric component overmolded onto the metal component so as to be connected to the metal component without fasteners, said body defining a recess;
a heat sink defined in said metal component;
a printed circuit board located in the recess, said printed circuit board including a plurality of electronic components mounted thereon;
said polymeric component comprising at least one attachment feature that captures the printed circuit board at a select location in the recess such that: (i) at least a first one of said electronic components is electrically connected to a contact region of the metal component that is exposed through a portion of said polymeric component; (ii) at least a second one of said electronic components is electrically isolated from said metal component by an electrical isolation zone of said polymeric component; and (ii) at least a third one of said electronic components is located adjacent a thermal transfer region of said metal component that underlies said heat sink, said thermal transfer region being uncovered by said polymeric component so as to be exposed in said recess.

* * * * *